(12) United States Patent
Wowra et al.

(10) Patent No.: US 8,642,389 B2
(45) Date of Patent: Feb. 4, 2014

(54) METHOD OF MANUFACTURING A SEMICONDUCTOR DEVICE

(75) Inventors: Thomas Wowra, Munich (DE); Joachim Mahler, Regensburg (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 521 days.

(21) Appl. No.: 12/536,712

(22) Filed: Aug. 6, 2009

(65) Prior Publication Data

US 2011/0031602 A1 Feb. 10, 2011

(51) Int. Cl.
*H01L 21/00* (2006.01)
(52) U.S. Cl.
USPC .......................................... 438/114; 438/612
(58) Field of Classification Search
USPC ........... 438/108, 110, 114, 612; 257/E21.503
See application file for complete search history.

(56) References Cited

U.S. PATENT DOCUMENTS

| | | | | |
|---|---|---|---|---|
| 4,798,645 | A * | 1/1989 | Pak | 156/716 |
| 6,323,062 | B1 * | 11/2001 | Gilleo et al. | 438/114 |
| 2001/0003058 | A1 * | 6/2001 | Gilleo et al. | 438/612 |
| 2002/0064935 | A1 * | 5/2002 | Honda | 438/622 |
| 2008/0061115 | A1 | 3/2008 | Ostmann et al. | |

FOREIGN PATENT DOCUMENTS

DE 10 2006 036 728 2/2008
JP 8-070081 3/1996

* cited by examiner

*Primary Examiner* — William D Coleman
*Assistant Examiner* — John M Parker
(74) *Attorney, Agent, or Firm* — Dicke, Billig & Czaja, PLLC (57) ABSTRACT

The method comprises providing multiple chips attached to a first carrier, stretching the first carrier so that the distance between adjacent ones of the multiple chips is increased, and applying a laminate to the multiple chips and the stretched first carrier to form a first workpiece embedding the multiple chips, the first workpiece having a first main face facing the first carrier and a second main face opposite to the first main face.

15 Claims, 10 Drawing Sheets

METHOD OF MANUFACTURING A SEMICONDUCTOR DEVICE

BACKGROUND OF THE INVENTION

The present invention relates to a method of manufacturing a semiconductor device and to a semiconductor device.

Semiconductor chips include contact pads or contact elements on one or both of their main surfaces. In a semiconductor chips device or semiconductor chip package the semiconductor chip is embedded or housed within the chip device and the contact elements of the semiconductor chip are connected to external contact elements of the chip device.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not to scale or not necessarily to scale relative to each other. Like reference numerals designate corresponding similar parts.

Aspects of the invention are made more evident in the following detailed description of embodiments when read in conjunction with the attached drawing figures, wherein.

DETAILED DESCRIPTION OF THE INVENTION

In the following detailed description, reference is made to the accompanying drawings, which form a part hereof, and in which is illustrated by way of illustration specific embodiments. In this regard, directional terminology, such as "top", "bottom", "front", "back", "leading", "trailing", etc., is used with reference to the orientation of the figure(s) being described. Because components of embodiments can be positioned in a number of different orientations, the directional terminology is used for purposes of illustration and is in no way limiting. It is to be understood that structural changes may be made within the specific embodiment.

The aspects and embodiments are described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are illustrated in schematic form in order to facilitate describing one or more aspects of the embodiments. It is to be understood that other embodiments may be utilized and structural or logical changes may be made without departing from the scope of the present invention.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a semiconductor chip device and a method of manufacturing a semiconductor chip device each comprise at least one semiconductor chip. The semiconductor chips described herein may be of different types, may be manufactured by different technologies and may include for example integrated electrical, electro-optical or electro-mechanical circuits and/or passives. The semiconductor chips may, for example, be configured as MOSFETs (Metal Oxide Semiconductor Field Effect Transistors), IGBTs (Insulated Gate Bipolar Transistors), JFETs (Junction Gate Field Effect Transistors), bipolar transistors or diodes. Furthermore, the semiconductor wafers and chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its front side and backside. By way of example, the source electrode and gate electrode of a power MOSFET may be situated on one main surface, while the drain electrode of the power MOSFET may be arranged on the other main surface. Furthermore, the devices described below may include integrated circuits to control the integrated circuits of other semiconductor chips, for example the integrated circuits of power semiconductor chips. The semiconductor chips described herein may be manufactured from any specific semiconductor material, for example Si, SiC, SiGe, GaAs, etc., and, furthermore, may contain inorganic and/or organic materials that are not semiconductors, such as for example insulators, plastics or metals.

In several embodiments layers or layer stacks are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on.

Furthermore, the semiconductor chips described below may comprise contact elements or contact pads on one or more of their outer surfaces wherein the contact elements serve for electrically contacting the semiconductor chips. The contact elements may have the form of lands, i.e. flat contact layers on an outer surface of the semiconductor chip. The metal layer(s) of which the contact elements are made may be manufactured with any desired material composition. Any desired metal or metal alloy, for example aluminum, titanium, gold, silver, copper, palladium, platinum, nickel, chromium or nickel vanadium, may be used as a layer material. The metal layer(s) need not be homogeneous or manufactured from just one material, that is to say various compositions and concentrations of the materials contained in the metal layer(s) are possible. The contact elements may be situated on the active main surfaces of the semiconductor chips or on other surfaces of the semiconductor chips.

The semiconductor chips may become covered with an encapsulating material. The encapsulating material can be in principle any electrically insulating material like, for example, any kind of molding material, any kind of epoxy material, or any kind of resin material. In one embodiment, the encapsulating material can be laminated on or over the semiconductor chip. More specifically, a resin coated copper (RCC) layer, which is known in the art and is comprised of a resin layer applied to a copper layer, can be used for covering the semiconductor chips as will be illustrated in further detail below.

In the claims and in the following description different embodiments of a method of manufacturing a semiconductor chip device are described as a particular sequence of processes or measures, in one embodiment in the flow diagrams. It is to be noted that the embodiments should not be limited to the particular sequence described. Particular ones or all of the processes or measures can also be conducted simultaneously or in any other useful and appropriate sequence.

Figure 1:
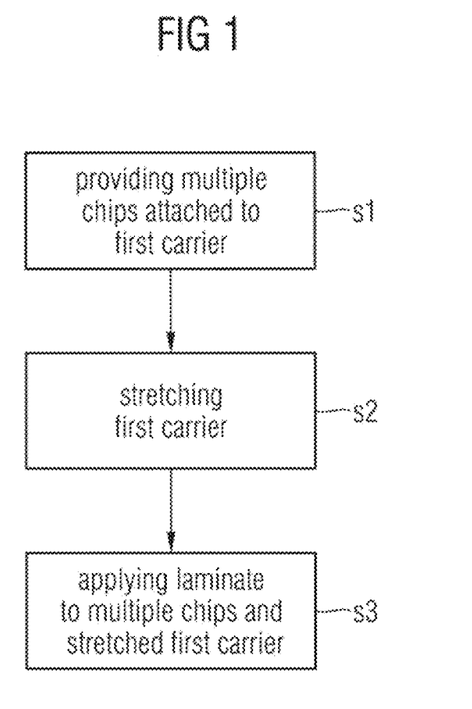
FIG. 1 illustrates a flow diagram of a method of manufacturing a semiconductor device according to an embodiment.

Referring to FIG. 1, there is illustrated a flow diagram of a method of manufacturing a semiconductor device according to an embodiment. The method comprises providing multiple chips attached to a first carrier (s1), stretching the first carrier so that the distance between adjacent ones of the multiple chips is increased (s2), and applying a laminate to the multiple chips and the stretched first carrier to form a first workpiece embedding the multiple chips, the first workpiece having a first main face facing the first carrier and a second main face opposite to the first main face (s3).

Figure 2A:
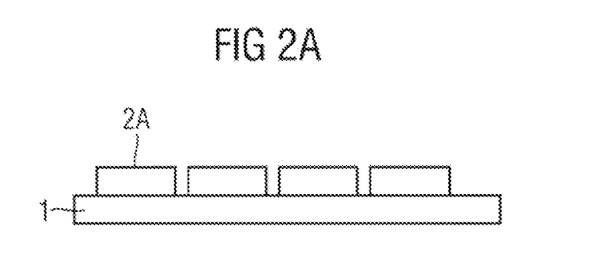
FIGS. 2A-C illustrates schematic cross-section representations of products for illustrating an embodiment of the method of fabricating a semiconductor device of FIG. 1.
Figure 2B:
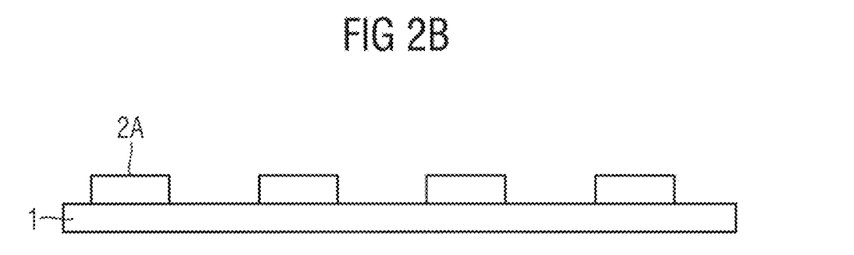
Figure 2C:
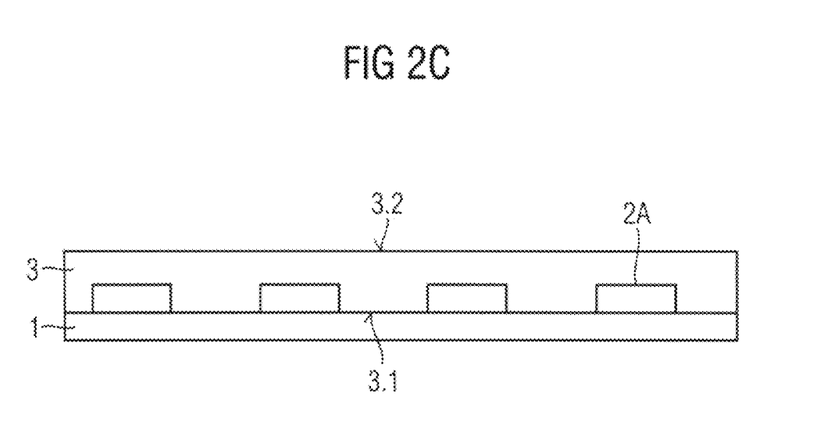

Referring to FIGS. 2A-C, there are illustrated cross-sectional representations of products for illustrating a method of manufacturing a semiconductor device according to an embodiment of the method of FIG. 1. FIG. 2A shows a cross-sectional representation of a first carrier 1 and multiple semiconductor chips 2A attached to a first, upper surface of the first carrier 1. FIG. 2B shows a cross-sectional representation of the first carrier 1 with the attached multiple chips 2A wherein the first carrier 1 has been stretched so that the distance between adjacent ones of the multiple chips 2A is increased. FIG. 2C shows a cross-sectional representation of a product obtained after applying a laminate 3 to the multiple chips 2 and the stretched first carrier 1. The laminate 3 embedding the multiple chips 2A forms a first workpiece having a first main face 3.1 facing the first carrier 1 and a second main face 3.2 opposite to the first main face 3.1.

According to an embodiment of the method of manufacturing a semiconductor device of FIGS. 1 and 2, the method further comprises attaching a processed wafer to the first carrier 1, the processed wafer including the multiple processed semiconductor chips or dies, and thereafter structuring the wafer into multiple separated chips attached to the first carrier 1.

According to an embodiment of the method of manufacturing a semiconductor device of FIGS. 1 and 2, the laminate comprises a first layer including an electrically insulating material and a second layer including an electrically conducting material. In one embodiment, the laminate can be comprised of a resin coated copper (RCC) layer including a resin layer attached to a copper layer.

According to an embodiment of the method of manufacturing a semiconductor device of FIGS. 1 and 2, each of the semiconductor chips has contact elements and the multiple chips are attached to the first carrier with the multiple contact elements facing away from the first carrier.

According to an embodiment of the method of manufacturing a semiconductor device of FIGS. 1 and 2, the method further comprises coupling the second layer of the laminate with the multiple contact elements of the multiple semiconductor chips.

According to an embodiment of the method of manufacturing a semiconductor device of FIGS. 1 and 2, the method further comprises structuring the second layer of the laminate.

According to an embodiment of the method of manufacturing a semiconductor device of FIGS. 1 and 2, the method further comprises removing the first carrier from the first main face of the first workpiece.

According to an embodiment of the method of manufacturing a semiconductor device of FIGS. 1 and 2, the first carrier can be made of a conventional saw foil. The saw foil can be fabricated of a thermoplast material and, if appropriate, the thermoplast material can be enriched with additional materials like, for example, elastifying substances.

According to an embodiment of the method of manufacturing a semiconductor device of FIGS. 1 and 2, the method further comprises attaching a second carrier to the second main face of the first workpiece.

According to an embodiment of the method of manufacturing a semiconductor device of FIGS. 1 and 2, the method further comprises singulating multiple embedded chips from the first workpiece.

According to an embodiment of the method of manufacturing a semiconductor device of FIGS. 1 and 2, the method further comprises stretching the second carrier so that the distance between adjacent ones of the multiple embedded chips is increased.

According to an embodiment of the method of manufacturing a semiconductor device of FIGS. 1 and 2, the method further comprises applying electrically conducting material to the multiple chips and the stretched second carrier to form a second workpiece embedding the multiple embedded chips, the second workpiece having a first main face facing the second carrier and a second main face opposite to the first main face.

According to an embodiment of the method of manufacturing a semiconductor device of FIGS. 1 and 2, the method further comprises singulating multiple embedded chips from the second workpiece.

According to an embodiment of the method of manufacturing a semiconductor device of FIGS. 1 and 2, the method further comprises removing the second carrier from the first face of the second workpiece.

The above method of manufacturing a semiconductor device of FIGS. 1 and 2 includes low number of processes, high potential for miniaturization, high device reliability, reduced process costs and an overall cost-effective production method.

Figure 3:
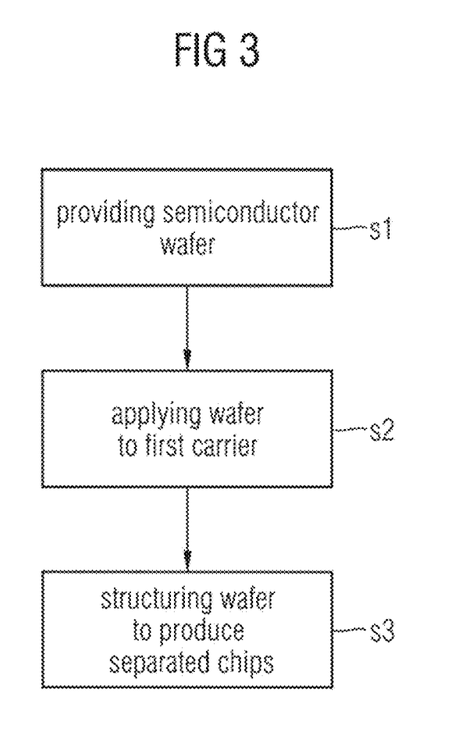
FIG. 3 illustrates a flow diagram of a method of manufacturing a semiconductor device according to an embodiment.

Referring to FIG. 3, there is illustrated a flow diagram of a method of manufacturing a semiconductor device according to an embodiment. The method comprises providing a semiconductor wafer including multiple chips (s1), attaching the wafer to a first carrier (s2), structuring the semiconductor wafer to produce separated multiple semiconductor chips (s3), and stretching the first carrier so that the distance between adjacent ones of the multiple chips is increased.

Figure 4A:
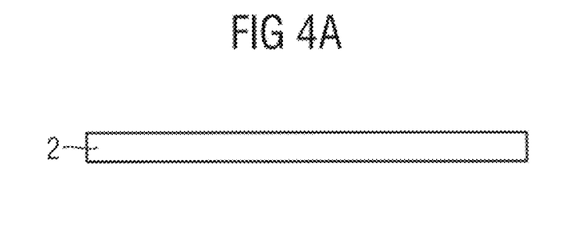
FIGS. 4A-D illustrates schematic cross-section representations of products for illustrating an embodiment of the method of fabricating a semiconductor device of FIG. 3.
Figure 4B:
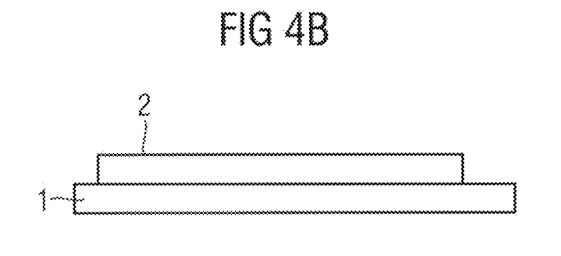
Figure 4C:
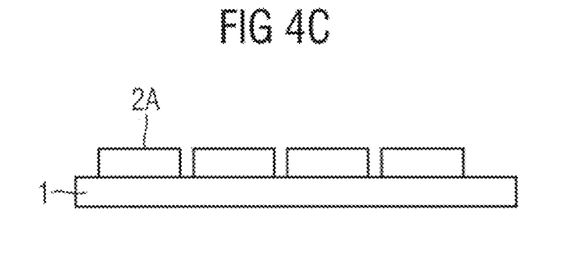
Figure 4D:
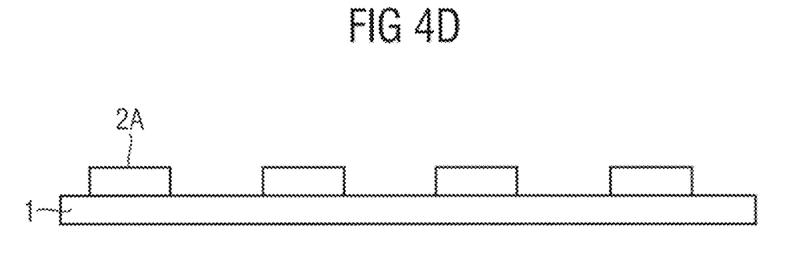

Referring to FIGS. 4A-D, there are illustrated cross-sectional representations of products for illustrating a method of manufacturing a semiconductor device according to an embodiment of FIG. 3. FIG. 4A shows a cross-sectional representation of a semiconductor wafer 2 including multiple chips or dies processed by any appropriate method in areas or sections of the wafer 2. FIG. 4B shows a cross-sectional representation of a product obtained after attaching the semiconductor wafer 2 to a first carrier 1. FIG. 4C—illustrates a cross-sectional representation of a product obtained after structuring the semiconductor wafer 2 to produce separated multiple semiconductor chips 2A. The structuring can, in principle, be done by any appropriate method like, for example, sawing, etching, ion milling etc. FIG. 4D—illustrates a cross-sectional representation of a product obtained after stretching the first carrier 1 so that the distance between adjacent ones of the multiple chips 2A is increased.

According to an embodiment of the method of manufacturing a semiconductor device of FIGS. 3 and 4, the method further includes applying a laminate to the multiple chips and the stretched first carrier to form a first workpiece embedding the multiple chips, the first workpiece having a first main face facing the first carrier and a second main face opposite to the first main face.

Further embodiments of the method of manufacturing a semiconductor device of FIGS. 3 and 4 can be formed according to the embodiments as outlined above in connection with FIGS. 1 and 2.

Referring to FIGS. 5A-K, there are illustrated cross-sectional representations of products for illustrating a method of manufacturing a semiconductor device according to an embodiment.

Figure 5A:
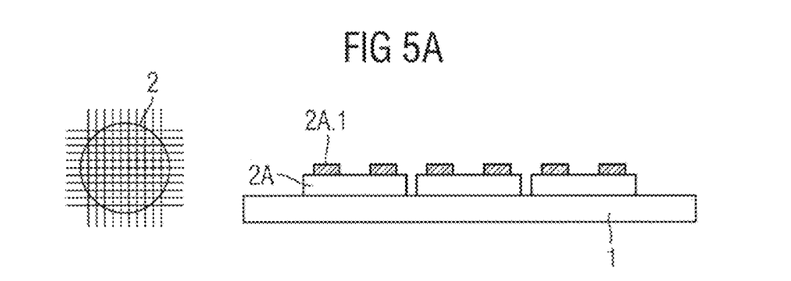
FIGS. 5A-K illustrates schematic cross-section representations of products for illustrating an embodiment of a method of manufacturing a semiconductor device.

Referring to FIG. 5A, at first a semiconductor wafer 2 is completely processed in that multiple semiconductor chips or dies are processed in the semiconductor wafer 2 by methods known in the art. The processed semiconductor wafer 2 is then attached to a first carrier 1 which can include a conventional saw foil. The saw foil has elastic properties and can be stretched in an elastic manner into several directions as will be illustrated further below. The saw foil can be fabricated of a thermoplast material which can be enriched by elastifying additives. After attaching the semiconductor wafer 2 to the saw foil 1 the semiconductor wafer 2 can be structured by sawing it into a plurality of separated semiconductor chips 2A. The result is depicted in the right partial picture of FIG. 5A. In the left partial picture of FIG. 5A a top view of the arrangement is illustrated wherein the wafer 2 is illustrated arranged on the unstretched saw foil together with the sawing lines for sawing the wafer 2 into individual semiconductor chips 2A. The right partial picture of FIG. 5A illustrates the cross-sectional representation after the structuring of the semiconductor wafer 2. In the present embodiment the semiconductor chips 2A have contact elements 2A.1 on both main surfaces of the chip. The semiconductor chips 2A can, for example, include a vertical transistor structure having a drain contact element at the backside of the chip and source and gate contact elements at the front side of the chip. The contact elements 2A.1 can include contact pad and an additional metallization layer formed above the contact pad. The metallization can, for example, be made of conductive glue, soft solder, diffusion solder, a galvanic metallization layer, in particular a galvanically deposited copper layer, metallic bumps of any solderable metallic material, or by metal nanopaste, that is bonded under temperature and pressure, e.g. 30 minutes at 200°-300°, in one embodiment 275°.

Figure 5B:
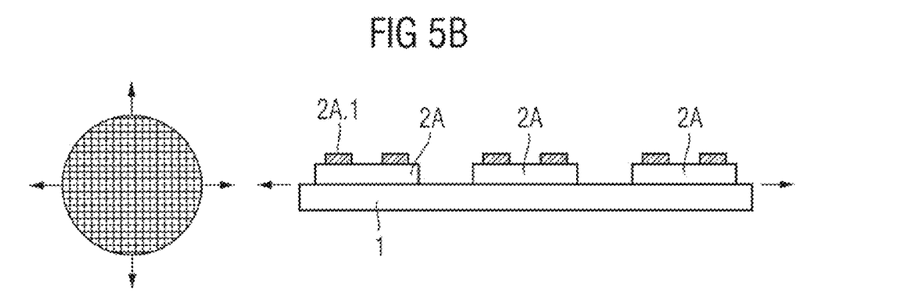

Referring to FIG. 5B, there is illustrated a cross-sectional representation of a product and a top view of the arrangement (left partial picture) obtained after stretching of the saw foil (right partial picture). As can be seen in the top view representation, the stretching of the saw foil can be done by pulling the saw foil into four different directions so that the saw foil will be homogeneously stretched. The right partial picture illustrates that the semiconductor chips 2A have now an increased distance between adjacent ones of the chips 2A.

Figure 5C:
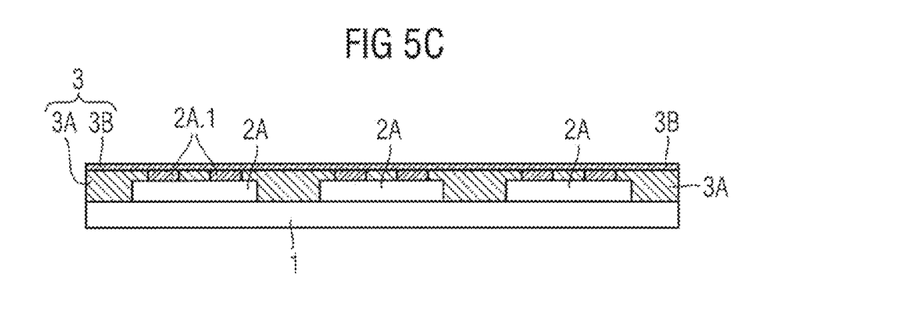

Referring to FIG. 5C, there is illustrated a cross-sectional representation of a product obtained after applying a laminate 3 to the semiconductor chips 2A and the stretched saw foil 1. In the present embodiment the laminate 3 is made of a resin coated copper (RCC) foil which consists of a resin layer 3A attached to a copper layer 3B. The RCC foil 3 is typically fabricated by providing a copper foil 3B including a thickness 1 μm to 20 μm, more specifically 5 μm to 12 μm, and roughening one of the main surfaces of the copper foil 3B so that it will have a surface roughness which is greater than the surface roughness of the respective other main surface of the copper foil 3B. The copper foil 3B is then attached or bonded to the resin layer 3A so that the surface with the high surface roughness is contacted with one main surface of the resin layer 3A. The process of laminating the RCC foil 3 onto the chips 2 and the first carrier 1 is a combined pressure and heating process in which the RCC foil 3 is pressed onto the chips 2 at a temperature which is sufficiently high so that the resin material of the resin layer 3A becomes flowable. Due to a sufficiently high flowability of the resin material of the resin layer 3A the chips 2A with their contact elements 2A.1 penetrate through the resin material of the resin layer 3A and push the resin material aside so that they progressively occupy a space within the resin layer 3A which was filled with resin material before the lamination process. As a result, the chips 2A are embedded within the resin layer 3A and the resin layer 3A covers the upper surface of the first carrier 1 and the upper surface of the chips 2A and the side surfaces of the chips 2A. In the present embodiment the overall conditions of the lamination process, in one embodiment the thickness of the RCC foil 3, the selected temperature and the pressure selected for pressurizing the RCC foil 3 onto the chips 2A are such that the chips 2A can completely penetrate through the resin layer 3A so that the contact elements 2A.1 will reach the copper foil 3B. In the present embodiment the contact elements 2A.1 include the source and gate contacts of the vertical transistor of the chip 2A and the backside metallization includes the drain contact of the chip 2A. The lamination process thus accomplishes a direct contact between the source and gate contact elements of the chips 2A with the copper foil 3B so that the copper foil 3B is adhesively bonded to the source and gate contact elements 2A.1. In another embodiment which will be outlined further below, the lamination process and its conditions are such that the chips 2A will not completely penetrate through the resin layer 3A.

Figure 5D:
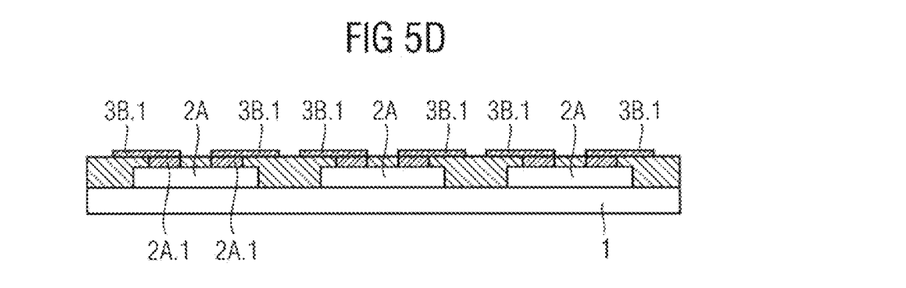

Referring to FIG. 5D, there is illustrated a cross-sectional representation of a product obtained after a structuring process of the copper foil 3B of the RCC foil 3. The structuring process is performed for the purpose of obtaining conductive areas 3B.1 electrically connected with the contact elements 2A.1 of the chips 2A. The structuring process can be done by different technologies one of which can be, for example, a conventional photolithographic structuring technology by use of a photoresist and an etching process. In one embodiment removal of portions of the copper foil 3B can also be accomplished by using laser ablation.

Figure 5E:
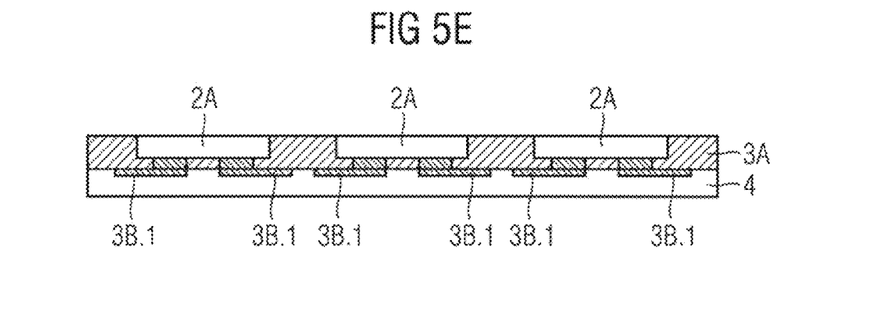

Referring to FIG. 5E, there is illustrated a cross-sectional representation of a product obtained after removal of the first carrier 1, turning the product of FIG. 5D and fixing the product upside down onto a second carrier 4 which can also be comprised of a saw foil and which can be made of the same or similar material as the first carrier 1. In one embodiment the second carrier 4 can also have elastic properties and it can also be fabricated of a thermoplast material enriched with elastifying additives.

Figure 5F:
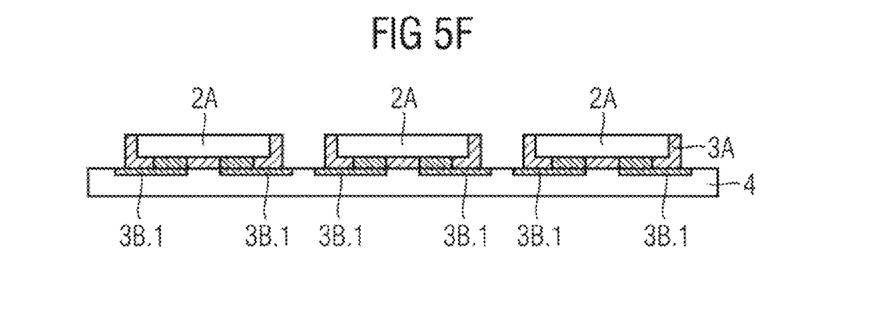

Referring to FIG. 5F, there is illustrated a cross-sectional representation of a product obtained after selective removal of portions of the resin layer 3A between the chips 2A. The selective removal can be done by different means. In one embodiment the selective removal of the portions of the resin layer 3A can be performed by using laser ablation if the material of the resin layer 3A is comprised of an appropriate laser ablatable composition. In one embodiment the portions of the resin layer 3A can also be removed by other means like, for example, one or more of etching, ion milling, or conventional photolithographic structuring technology.

Figure 5G:
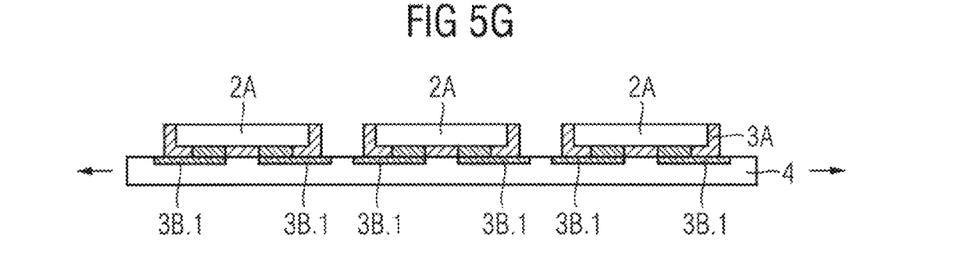

Referring to FIG. 5G, there is illustrated a cross-sectional representation of a product obtained after stretching the second carrier 4 so that the distance between adjacent semiconductor devices is increased in a homogeneous manner over the whole workpiece. The stretching of the second carrier 4 can be done in the same way as was described with respect to FIG. 5B for the stretching of the first carrier 1.

Figure 5H:
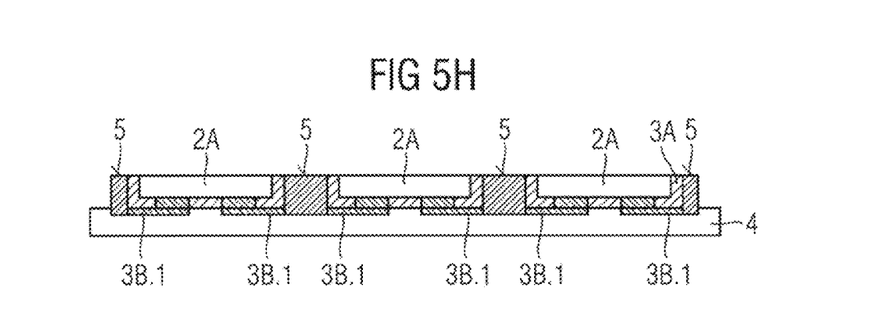

Referring to FIG. 5H, there is illustrated a cross-sectional representation of a product obtained after metallization of the empty spaces between the semiconductor devices in order to fabricate electrical through-connects for electrically connecting the contact elements 2A.1 to the opposing surface of the resin layer 3A. The metallization process can includes, for example, deposition of a seed layer and subsequent galvanic metallization or in one embodiment by applying soldering paste, conductive ink or any other conductive paste into the empty spaces. By the metallization process electrical connection portions 5 are fabricated.

Figure 5I:
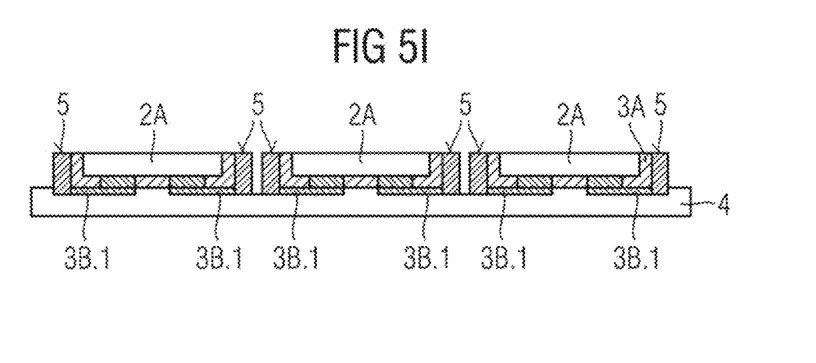

Referring to FIG. 5I, there is illustrated a cross-sectional representation of a product obtained after structuring the product into separate semiconductor chips while attached to the second carrier 4. The structuring of the workpiece can be performed, for example, by sawing or etching through the electrical connection portions 5. Afterwards the semiconductor devices are released from the second carrier 4.

Figure 5J:
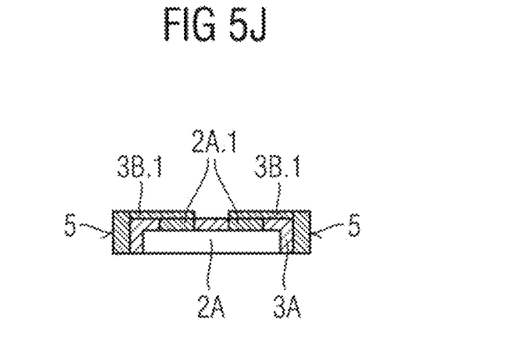

Referring to FIG. 5J, there is illustrated a cross-sectional representation of a semiconductor device obtained after releasing from the second carrier 4. The semiconductor device as illustrated can be connected as it is on a printed circuit board.

Figure 5K:
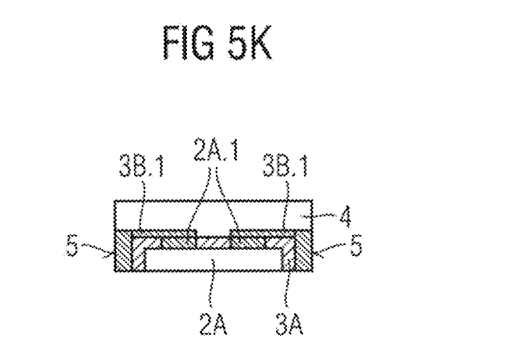

Referring to FIG. 5K, there is illustrated a cross-sectional representation of a product obtained after structuring the workpiece as illustrated in FIG. 5I and afterwards separating the product into individual semiconductor devices while retaining the second carrier 4 onto the semiconductor devices. The saw foil having served as second carrier 4 during the fabrication process can now serve as a protection layer onto the semiconductor device on a surface opposite to the electrical contact elements.

Figure 6A:
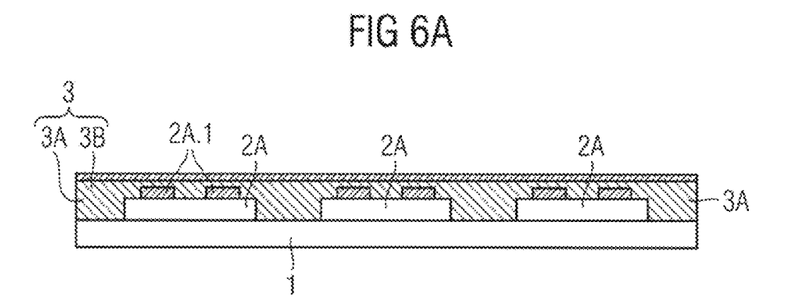
FIGS. 6A-C illustrates schematic cross-section representations of products for illustrating an embodiment of a method of manufacturing a semiconductor device.
Figure 6B:
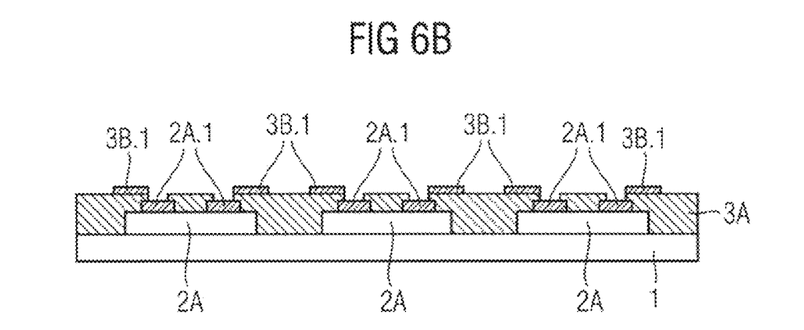
Figure 6C:
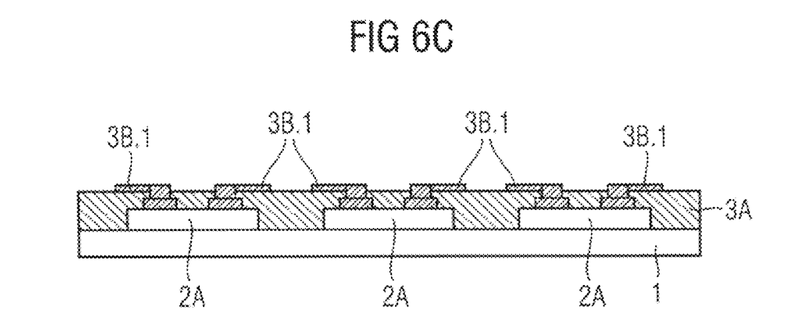

Referring to FIGS. 6A-C, there are illustrated cross-sectional representations of products for illustrating a method of manufacturing a semiconductor device according to an embodiment. This embodiment can be seen as an alternative to the embodiment of FIGS. 5A-K, and FIGS. 6A-C of the alternative embodiment can be compared with FIGS. 5C and 5D of the previous embodiment.

Referring to FIG. 6A, there is illustrated a cross-sectional representation of a product obtained after lamination of the RCC layer 3 onto the semiconductor chips 2A and the first carrier 1. However, as was outlined with the previous embodiment, the conditions of the lamination process and/or the thickness of the RCC layer 3 can be such that during the lamination process the semiconductor chips 2A can not completely penetrate through the resin layer 3A of the RCC layer 3 so that a direct contacting between the contact elements 2A.1 of the semiconductor chips 2 and the foil layer 3B of the RCC layer 3 is not possible. Therefore, after completion of the lamination process, the copper foil 3B is separated from the upper surface of the contact elements 2A.1 by material of the resin layer 3A.

Referring to FIG. 6B, there is illustrated a cross-sectional representation of a product obtained after structuring of the RCC layer 3 with the purpose of fabricating conductive areas 3B.1. At the same time an upper layer of the resin layer 3A above the contact elements 2A.1 is also removed with the purpose of generating a via hole to the contact element 2A.1 and preparing the forming of connection metallizations between the conductive areas 3B.1 and the contact elements 2A.1.

Referring to FIG. 6C, there is illustrated a cross-sectional representation of a product obtained after forming the connection metallizations between the conductive areas 3B.1 and the contact elements 2A.1. The forming of the connection metallizations can be performed by filling of the vias in the upper layer of the resin layer 3A with soldering paste, conductive ink, or any other conductive paste or in another embodiment galvanic metallization. Thereafter the process can be continued according to FIG. 5E of the previous embodiment.

Referring to FIGS. 7A-E, there are illustrated cross-sectional representations of products for illustrating a method of manufacturing a semiconductor device according to an embodiment. This embodiment can be seen as a further alternative to the embodiment of FIGS. 5A-K and FIGS. 7A-C of the further alternative embodiment can be compared with FIGS. 5F-K of the previous embodiment.

Figure 7A:
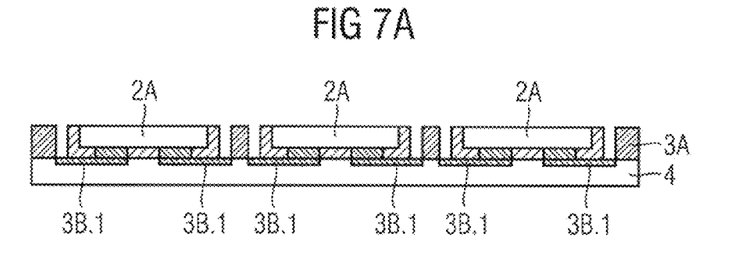
FIGS. 7A-E illustrates schematic cross-section representations of products for illustrating an embodiment of a method of manufacturing a semiconductor device.

Referring to FIG. 7A, there is illustrated a cross-sectional representation of a product obtained after forming of via connections through the resin layer 3A for the purpose of the later forming of through-connects through the resin layer 3A. In contrast to FIG. 5F of the above embodiment, in the present embodiment the number of fabricated via holes through the resin layer 3A corresponds to the number of conductive areas 3B.1 so that each one of the conductive areas 3B.1 will have its own via hole and later its own through-connect through the resin layer 3A. As a result after singulating the obtained semiconductor chips will have a side protection wall consisting of a portion of the resin layer 3A as will be seen later. The fabrication of the via holes through the resin layer 3A can be performed, for example, by laser ablation or other methods as was outlined above.

The process of stretching of the second carrier 4, as illustrated in the previous embodiment in FIG. 5G, is omitted here for reasons of simplification.

Figure 7B:
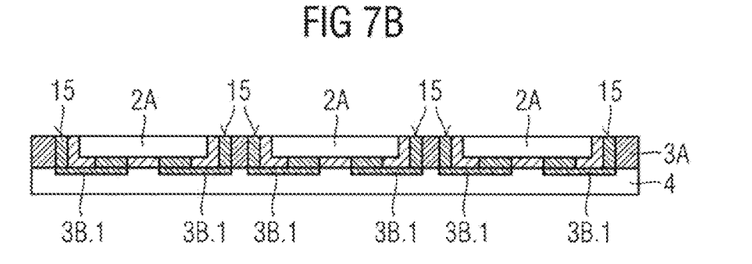

Referring to FIG. 7B, there is illustrated a cross-sectional representation of a product obtained after metallization of the via holes for the purpose of fabricating through-connects. The metallization can be done by depositing of a seed layer and subsequent galvanic metallization or, in one embodiment, by applying soldering paste, conductive ink or any other sort of conductive paste into the vias. By the metallization process electrical connection portions 15 are fabricated.

Figure 7C:
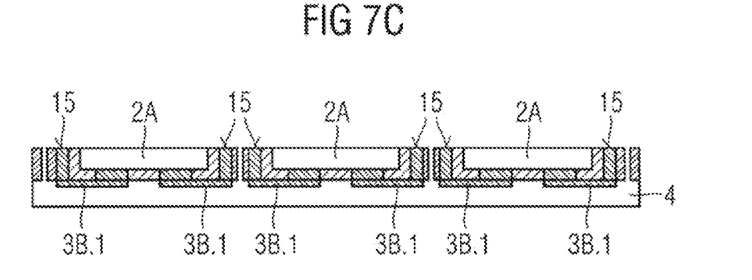
Figure 7D:
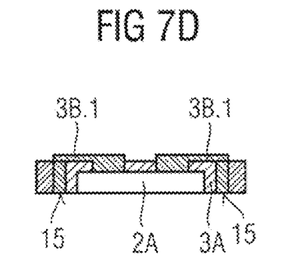
Figure 7E:
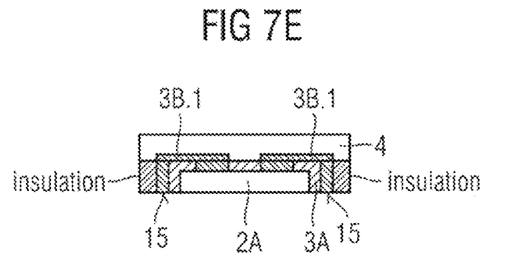

Referring to FIG. 7C, there is illustrated a cross-sectional representation of a product obtained after structuring of the workpiece above the second carrier 4 by sawing the resin layer 3A and thus separating individual semiconductor devices from each other. As explained above in connection with FIGS. 5I-K, a semiconductor device as illustrated in FIG. 7D can be obtained or a semiconductor device having a protective layer formed by previous second carrier 4 can be obtained as illustrated in FIG. 7E. It can be seen that both these semiconductor devices comprise side wall protection layers (denoted as "insulation") formed by portions of the resin layer 3A.

Figure 8:
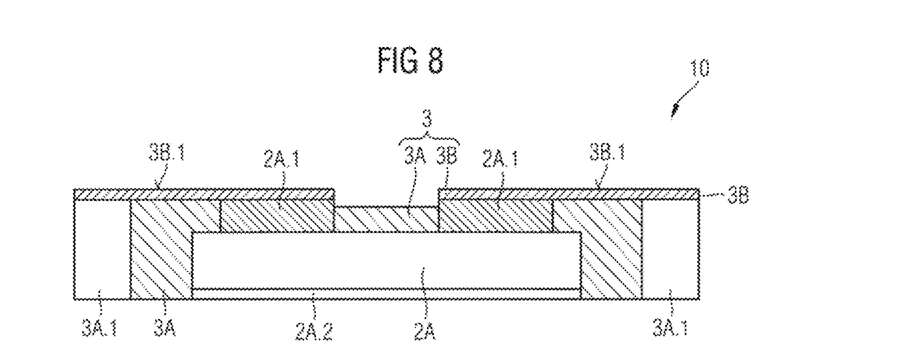
FIG. 8 illustrates a schematic cross-section representation of a semiconductor device according to an embodiment.

Referring to FIG. 8, there is illustrated a cross-sectional representation of a semiconductor device according to an embodiment. The semiconductor device 10 comprises a semiconductor chip 2A including contact elements 2A.1 on a surface of the chip 2A, a resin coated copper (RCC) layer 3 including a resin layer 3A applied to a copper layer 3B, wherein the semiconductor chip 2A is covered by the resin layer 3A, and the copper layer 3B comprises conductive areas 3B.1, each one of the conductive areas 3B.1 being electrically connected with one of the contact elements 2A.1 of the chip 2A. The copper layer 3B comprises a first surface applied to the first surface of the resin layer 2A and a second surface opposed to the first surface wherein the first surface may have a surface roughness which is higher than the surface roughness of the second surface.

The conductive areas 3B.1 can further be connected with through-connects 3A.1 extending from one main surface of the resin layer 3A to another opposing main surface of the resin layer 3A. The semiconductor chip 2A can further comprise a contact element 2A.2 on a surface opposed to the surface including the contact elements 2A.1. The semiconductor device 10 can thus be surface mounted onto a printed circuit board (PCB).

According to an embodiment of the semiconductor device 10, a contact metallization is provided in-between each one of the contact elements 2A.1 and the respective conductive area 3B.1. In other words, the contact elements 22A.1 can be comprised of contact pads on the chip surface and metallizations for making contact to the conductive areas 23B.1. The metallization can, for example, be made of conductive glue, soft solder, diffusion solder, a galvanic metallization layer, in one embodiment a galvanically deposited copper layer, metallic bumps of any solderable metallic material, or by metal nanopaste, that is bonded under temperature and pressure, e.g. 30 minutes at 200°-300°, in one embodiment 275°.

According to an embodiment of the semiconductor device 10, one of the main surfaces of the semiconductor device 10, which comprises the conductive areas 3B.1, is covered by a protective layer which is fabricated of an elastic foil.

Figure 9:
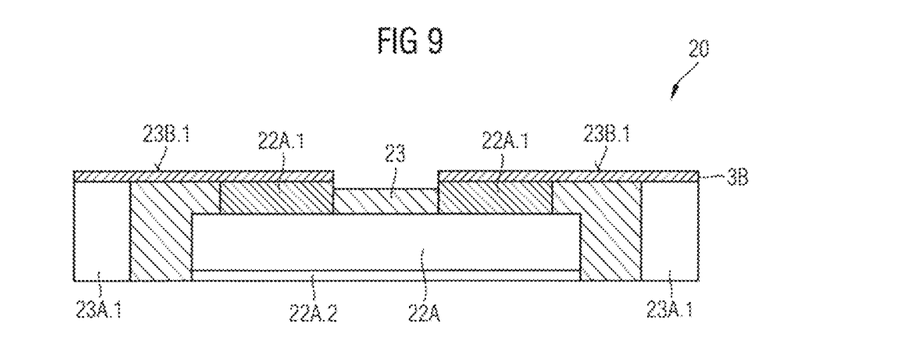
FIG. 9 illustrates a schematic cross-section representation of a semiconductor device according to an embodiment.

Referring to FIG. 9, there is illustrated a cross-sectional representation of a semiconductor device according to an embodiment. The semiconductor device 20 comprises a semiconductor chip 22A including contact elements 22A.1 on a surface of the chip 22A, a material layer 23 covering the semiconductor chip 22A, electrically conductive areas 23B.1 applied to a first surface of the material layer 23, each one of the electrically conductive areas 23B.1 being electrically connected with one of the contact elements 22A.1 of the chip 22A, each one of the conductive areas 23B.1 including a first surface and a second surface opposite to the first surface, wherein the first surface is applied to the first surface of the material layer 23 and the second surface is situated remote from the material layer 23 and wherein the first surface has a surface roughness which is higher than the surface roughness of the second surface. The difference of the surface roughness is indicated in FIG. 9.

According to an embodiment of the semiconductor device 20, a contact metallization is provided in-between each one of the contact elements 22A.1 and the respective conductive area 23B.1. In other words, the contact elements 22A.1 can be comprised of contact pads on the chip surface and metallizations for making contact to the conductive areas 23B.1. The metallization can, for example, be made of conductive glue, soft solder, diffusion solder, a galvanic metallization layer, in one embodiment a galvanically deposited copper layer, metallic bumps of any solderable metallic material, or by metal nanopaste, that is bonded under temperature and pressure, e.g. 30 minutes at 200°-300°, in one embodiment 275°.

According to an embodiment of the semiconductor device 20, the material layer 23 further comprises a second surface, and the conductive areas 23B.1 are each connected to an electrical connection 23A.1, respectively, the electrical connection 23A.1 reaching from the first surface of the material layer 23 to the second surface of the material layer 23.

According to an embodiment of the semiconductor device 20, one of the main surfaces of the semiconductor device 10, which comprises the conductive areas 3B.1, is covered by a protective layer which is fabricated of an elastic foil.

According to an embodiment of the semiconductor device 20, the material layer 23 is comprised of a resin layer. In one embodiment, the material layer 23 can be part of a resin coated copper (RCC) layer including a resin layer 23 applied to a copper layer 23B, wherein the semiconductor chip 2A is covered by the resin layer 23, and the copper layer 3B comprises the conductive areas 3B.1.

What is claimed is:

1. A method of manufacturing a semiconductor device, comprising:
   providing multiple chips attached to a first carrier;
   stretching the first carrier so that the distance between adjacent ones of the multiple chips is increased; and
   applying a laminate to the multiple chips and the stretched first carrier with pressure while heating to form a first workpiece having a first main face facing the first carrier and a second main face opposite to the first main face, the laminate having a first layer comprising an electrically insulating material facing the chips and the first carrier and forming a portion of the first main face, and a second layer comprising an electrically conductive material facing away from the chips and carrier and forming at least a portion of the second main face.

2. The method according to claim 1, wherein
   providing multiple chips attached to a first carrier comprises singulating the multiple chips from a wafer attached to the first carrier.

3. The method according to claim 1, wherein
each of the chips has contact elements and wherein the multiple chips are attached to the carrier with the multiple contact elements facing away from the carrier.

4. The method according to claim 3, further comprising:
electrically coupling the second layer of the laminate to the contact elements of the multiple chips.

5. The method of claim 4, wherein electrically coupling the second layer of the laminate to the contact elements of the multiple chips comprises pushing the laminate onto the multiple chips and carrier such that the contact elements extend through the first layer and contact the second layer.

6. The method according to claim 1, further comprising:
structuring the second layer.

7. The method according to claim 1, further comprising:
removing the first carrier from the first main face of the first workpiece.

8. The method according to claim 1, further comprising:
singulating multiple embedded chips from the first workpiece.

9. A method of manufacturing a semiconductor device, comprising:
providing multiple chips attached to a first carrier;
stretching the first carrier so that the distance between adjacent ones of the multiple chips is increased;
applying a laminate to the multiple chips and the stretched first carrier with pressure while heating to form a first workpiece having a first main face facing the first carrier and a second main face opposite to the first main face;
attaching a second carrier to the second main face of the first workpiece; and
stretching the second carrier so that the distance between adjacent ones of the multiple embedded chips is increased.

10. The method according to claim 9, further comprising:
applying electrically conducting material to the multiple chips and the stretched second carrier to form a second workpiece embedding the multiple embedded chips, the second workpiece having a first main face facing the second carrier and a second main face opposite to the first main face.

11. The method according to claim 10, further comprising:
singulating multiple embedded chips from the second workpiece.

12. The method according to claim 10, further comprising:
removing the second carrier from the first face of the second workpiece.

13. A method of manufacturing a semiconductor device, comprising:
providing a semiconductor wafer comprising multiple chips;
attaching the wafer to a first carrier;
structuring the semiconductor wafer to produce separated multiple chips;
stretching the first carrier so that the distance between adjacent ones of the multiple chips is increased; and
applying a laminated material to the multiple chips and the stretched first carrier to form a first workpiece embedding the multiple chips, the first workpiece having a first main face facing the first carrier and a second main face opposite to the first main face, wherein the laminate comprises a resin layer facing the multiple chips and the first carrier and a copper layer facing away from the multiple chips and the first carrier.

14. The method according to claim 13, wherein
each one of the chips has contact elements and wherein the multiple chips are attached to the carrier with the multiple contact elements facing away from the carrier.

15. The method according to claim 13, wherein the laminated material is applied with pressure while heating process.

* * * * *